United States Patent [19]

Ikehata et al.

[11] Patent Number: 5,012,835
[45] Date of Patent: May 7, 1991

[54] NOZZLE FLAPPER MECHANISM

[75] Inventors: Motoshige Ikehata; Hiroyuki Mikami; Naoto Inayama; Katsuhiko Odajima, all of Sohka, Japan

[73] Assignee: SMC Corporation, Tokyo, Japan

[21] Appl. No.: 507,879

[22] Filed: Apr. 12, 1990

Related U.S. Application Data

[62] Division of Ser. No. 301,708, Jan. 26, 1989, Pat. No. 4,934,401.

[30] Foreign Application Priority Data

Nov. 17, 1988 [JP] Japan .................. 63-290950

[51] Int. Cl.⁵ .......................................... G05D 16/20
[52] U.S. Cl. ................... 137/82; 251/129.06
[58] Field of Search ............... 137/82, 83; 251/129.06

[56]      References Cited
U.S. PATENT DOCUMENTS 3,063,422  11/1962  Gregowski et al. .
4,492,360   1/1985  Lee, II et al. .

FOREIGN PATENT DOCUMENTS 0109120   5/1984  European Pat. Off. .
0262637   6/1988  European Pat. Off. .
60-227078 11/1985  Japan .................. 251/129.06
62-246667 10/1987  Japan .................. 251/129.06
WO87/02514 4/1987  PCT Int'l Appl. .
1097013  12/1967  United Kingdom .
1185709   3/1970  United Kingdom .
1425093   2/1976  United Kingdom .
2134223   8/1984  United Kingdom .
2189933  11/1987  United Kingdom .

Primary Examiner—Alan Cohan
Attorney, Agent, or Firm—Burns, Doane, Swecker & Mathis

[57] ABSTRACT

A nozzle flapper mechanism includes an electrostrictive device, a plate member coupled to the electrostrictive device, a nozzle having an orifice facing the electrostrictive device or the plate member, and a controller for applying a voltage to the electrostrictive device to keep a nozzle back pressure constant or vary the nozzle back pressure. The electrostrictive device comprises a shim, piezoelectric ceramics members disposed on the shim, and thin-film electrodes disposed on the piezoelectric ceramics members, the electrodes having an area smaller than that of the piezoelectric ceramics members, the piezoelectric ceramics members having one end directly fixed in position on a stationary member.

3 Claims, 13 Drawing Sheets

NOZZLE FLAPPER MECHANISM

This application is a division of application Ser. No. 301,708, filed Jan. 26, 1939, now U.S. Pat. No. 4,934,401 issued Jun. 19, 1990.

BACKGROUND OF THE INVENTION

The present invention relates to a nozzle flapper mechanism, and more particularly to a nozzle flapper mechanism for use in an electropneumatic transducer for converting an electric signal to a fluid pressure signal, especially a pneumatic pressure signal, the nozzle flapper mechanism having, as a transducer element, a nozzle flapper being in the form of a bimorph electrostrictive (piezoelectric) device, and being capable of converting a low-voltage electric signal accurately to a pneumatic pressure signal.

Heretofore, torque motors have widely been used as a device for converting an electric signal to a pneumatic pressure signal. An electric current is supplied to the coil of the torque motor to produce a corresponding rotational movement which is converted to an amount of displacement for conversion into a pneumatic pressure signal through a nozzle flapper, a pilot valve, or the like. Where a control device such as an electropneumatic transducer is constructed of such a torque motor, the greater the torque produced by the torque motor, the higher the resistance the control device has against mechanical vibrations or disturbances and the more stable the control device is.

In view of the recent trend toward smaller and lighter control devices, it is very important to construct the torque motor in a small size. However, the smaller the torque motor, the lower the torque that can be generated by the torque motor dependent on the value of the electric current supplied thereto. As a result, the control device would be susceptible to mechanical vibrations or other disturbances, and it would be technically impossible to employ any torque motor in certain applications in which the control device is supposed to be used.

The inventor filed U.S. patent application Ser. No. 729,188 for an electropneumatic transducer unit which employs an electrostrictive device for converting an electric signal to a pneumatic pressure signal.

According to the invention of the above U.S. patent application, the electrostrictive device is of the bimorph type in the form of a thin rectangular shape having one end fixed and the other as a free end. When a voltage is applied to electrodes with the electrostrictive device fixed at one end, the free end thereof is slightly displaced. Therefore, where the electrostrictive device is constructed as a nozzle flapper, it can convert a variation in the applied voltage easily to a nozzle back pressure, i.e., a pneumatic pressure signal.

The electrostrictive device as a nozzle flapper may be fixed in position as follows: As shown in FIGS. 1 through 3 of the accompanying drawings, a nozzle flapper mechanism 2 includes a base 4 on which a first column-shaped fixing plate 6a is disposed. An electrostrictive device 8 is placed on the first fixing plate 6a. One end of the electrostrictive device 8 is fastened to the first fixing plate 6a by a second column-shaped fixing plate 6b which is coupled to the first fixing plate 6b by means of a pair of fastening screws 10 threaded into threaded holes in the first fixing plate 6a. A nozzle 12 is fixedly mounted on the base 4 and has a distal upper end positioned closely to the electrostrictive device 8. The other end of the electrostrictive device 8 remote from the first and second fixing plates 6a, 6b is not limited in motion, but serves as a free end.

The first and second fixing plates 6a, 6b may be made of an electrically insulative material or an electrically conductive material. Where they are made of an electrically conductive material, it is necessary to place insulating sheets on them in contact with electrodes of the electrostrictive device 8. An auxiliary plate 14 made of ceramics or the like is attached to the free end of the electrostrictive device 8 for preventing the electrostrictive device 8 from being damaged by the nozzle 12 when the electrostrictive device 8 is flexed when a voltage is applied thereto.

The electrostrictive device 8 is of the construction shown in FIG. 1. A rectangular shim 16 made of an electrically conductive material such as phosphor bronze stainless steel, or the like. Piezoelectric ceramics members 18a, 18b are bonded to upper and lower surfaces, respectively, of the shim 16 by an adhesive. Thin-film electrodes 19a, 19b are placed on upper and lower surfaces, respectively, of the piezoelectric ceramics members 18a, 18b. The piezoelectric ceramics members 18a, 18b cover most of the surface areas of the shim 16. When the electrostrictive device 8 is fixedly positioned by the fastening screws 10, the electrostrictive device 8 which is composed of the electrode 19a, the piezoelectric ceramics member 18a, the shim 16, the piezoelectric ceramics member 18b, and the electrode 19b, arranged in the order named in the upward direction, is firmly gripped between the first and second fixing plates 6a, 6b.

In operation, a DC voltage is applied to the electrostrictive device 8. Since the piezoelectric ceramics member 18b tends to extend and the piezoelectric ceramics member 18a tends to shrink, the free end of the electrostrictive device 8 is flexed largely toward the nozzle 12 and approaches the orifice of the nozzle 12. Since the amount of flexing displacement of the electrostrictive device 8 is proportional to the applied voltage, the nozzle flapper mechanism can produce a fluid pressure signal dependent on the applied voltage signal.

Generally, it is known that when a voltage is impressed on the electrostrictive device 8, the applied voltage and the amount of displacement of the free end of the electrostrictive device 8 are related to each other as shown in FIG. 4. As the applied voltage is gradually increased from 0, the electrostrictive device 8 is deformed along a curve from a to b in FIG. 4. When the applied voltage is thereafter lowered, the displacement curve goes from b to c, but not from b to a. When the voltage is applied again, the electrostrictive device 8 is deformed along another curve from c to b.

Stated otherwise, when the applied voltage is lowered and then increased again, the deformation of the electrostrictive device 8 undergoes hysteresis. This phenomenon of hysteresis particularly manifests itself with the bimorph electrostrictive device. Even if the same voltage is applied, the displacement of the free end of the electrostrictive device 8 is varied with time as indicated by a shift from the curve from b to c to a curve from b' to c'.

When a constant voltage remains applied to the electrostrictive device 8 for a certain period of time, the displacement of the free end of the electrostrictive device 8 is increased with time as represented by the solid-line curve in FIG. 5, the phenomenon being referred to as creeping of the electrostrictive device. The creeping is understood as depending upon the material of the piezoelectric ceramics, the thickness and material of the shim, the adhesive used, the manner in which the electrostrictive device is fixed, and other parameters. The inventor has made various attempts to avoid the creeping, and found that a displacement caused by the creeping ranges from 10% to several tens %. The creeping is liable to be promoted when the ambient temperature varies.

The creeping is caused largely by the characteristics which the electrostrictive device itself has. On the other hand, it has been confirmed that the creeping is also developed by the fact that the piezoelectric ceramics members 18a, 18b are fixed to the shim 16 by the adhesive, and that the first and second fixing plates 6a, 6b are curved at their opposite ends by the strongly tightened fastening screws 10 which are threaded into the base 4 through relatively large holes defined in the fixing plates 6a, 6b, thus pressing the corners of the electrostrictive device 8 as shown in FIG. 6. When a relatively low voltage, say about 10V, is applied to the electrostrictive device 8 for fine controlling action, any displacement caused on the electrostrictive device 8 is very small, resulting in the need for controlling movements for a distance on the order of a few microns. Accordingly, the forces with which the fastening screws 10 are to be tightened have to be adjusted very carefully.

However, it is virtually impossible to tighten the two fastening screws 10 with equal forces, and the electrostrictive device 8 is usually subjected to irregular stresses due to uneven screw tightening forces applied.

Furthermore, the portions of the piezoelectric ceramics members which are gripped by the fixing plates are also expanded and contracted by the application of a voltage thereto. Internal stresses developed in the piezoelectric ceramics members are therefore varied, causing the creeping which will make it difficult to effect accurate control. More specifically, upon application of a DC voltage to the electrostrictive device, the portions of the piezoelectric ceramics members which are held against the electrodes are expanded and contracted. With the piezoelectric ceramics members being tightened by the fixing plates, the above expansion and contraction cause stresses to be varied slightly in the tightened portions of the piezoelectric ceramics members. It has been confirmed that the electrostrictive device is expanded and contracted in a direction normal to the direction of forces with which it is tightened by the fixing plates, thereby producing local "slippage" of the electrostrictive device with respect to the fixing plates. Such slippage is also greatly responsible for the creeping.

The use of an electrostrictive device for the conversion of an electric signal to a pneumatic pressure signal is to achieve a desired signal conversion capability through accurate and fine electric control. Where the creeping as described above exists, however, even if a control voltage applied to the electrostrictive device is kept at a constant level to develop a fixed nozzle back pressure, the nozzle back pressure tends to be varied by the creeping. It would be essentially difficult to effect accurate control of a valve body or the like using a nozzle back pressure if the displacement of an electrostrictive device based on the creeping reached several tens %.

SUMMARY OF THE INVENTION

In view of the aforesaid drawbacks of the conventional nozzle flapper mechanisms, it is an object of the present invention to provide a nozzle flapper mechanism including piezoelectric ceramics members and electrodes, at least the piezoelectric ceramics members or the electrodes being either not gripped between fixing plates, or gripped between the fixing plates at as small a region as possible, or the piezoelectric ceramics members being directly held by a holder, so that the nozzle flapper mechanism is not affected by tightening forces applied by fastening screws and is capable of easily and accurately converting an electric signal to a pneumatic pressure signal.

Another object of the present invention is to provide a nozzle flapper mechanism comprising: an electrostrictive device; a plate member coupled to said electrostrictive device; a nozzle having an orifice facing said electrostrictive device or said plate member; and means for applying a voltage to said electrostrictive device to keep a nozzle back pressure constant or vary the nozzle back pressure; said electrostrictive device comprising a shim, a piezoelectric ceramics member disposed on said shim, and a thin-film electrode disposed on said piezoelectric ceramics member, said electrode having an area smaller than that of said piezoelectric ceramics member, said piezoelectric ceramics member having one end directly fixed in position.

Still another object of the present invention is to provide a nozzle flapper mechanism further including a fixing plate by which said one end of the piezoelectric ceramics member is fixed in position.

Yet another object of the present invention is to provide a nozzle flapper mechanism wherein said electrode has a narrow lead extending respectively therefrom and terminating short of an end of said piezoelectric ceramics member.

Yet another object of the present invention is to provide a nozzle flapper mechanism wherein said lead terminates at a longitudinal central portion of said piezoelectric ceramics member.

Yet still another object of the present invention is to provide a nozzle flapper mechanism wherein said lead terminates at a longitudinal end corner of said piezoelectric ceramics member.

A further object of the present invention is to provide a nozzle flapper mechanism wherein said fixing plate has a slot defined therein and receiving said lead.

A still further object of the present invention is to provide a nozzle flapper mechanism wherein said piezoelectric ceramics member has a slot defined therein and extending to the end thereof, said lead being received in said slot of the piezoelectric ceramics member.

A yet still further object of the present invention is to provide a nozzle flapper mechanism further including a spacer disposed between said piezoelectric ceramics plate and said fixing plate.

It is also an object of the present invention to provide a nozzle flapper mechanism comprising: an electrostrictive device; a plate member coupled to said electrostrictive device; a nozzle having an orifice facing said electrostrictive device or said plate member; and means for applying a voltage to said electrostrictive device to keep a nozzle back pressure constant or vary the nozzle back pressure; said electrostrictive device comprising a plurality of piezoelectric ceramics members, and a plurality of thin-film electrodes disposed on faces and backs of said piezoelectric ceramics members.

Yet another object of the present invention is to provide a nozzle flapper mechanism further including an electric conductor connected to alternating ones of said electrodes on said piezoelectric ceramics members and connecting said alternating ones of the electrodes to a power supply.

Yet another object of the present invention is to provide a nozzle flapper mechanism wherein said electrodes have leads extending respectively therefrom, the lead from each of said electrodes being positioned on an opposite side to the lead from an adjacent one of said electrodes.

Still another object of the present invention is to provide a nozzle flapper mechanism wherein the leads from said electrodes are positioned alternately on opposite sides.

Yet another object of the present invention is to provide a nozzle flapper mechanism comprising: an electrostrictive device; a plate member coupled to said electrostrictive device; a nozzle having an orifice facing said electrostrictive device or said plate member; and means for applying a voltage to said electrostrictive device to keep a nozzle back pressure constant or vary the nozzle back pressure; said electrostrictive device comprising a shim, a piezoelectric ceramics member disposed on said shim, and a thin-film electrode disposed on said piezoelectric ceramics member, said electrode having an area smaller than that of said piezoelectric ceramics member, said piezoelectric ceramics member having one end fixed to a holder directly by soldering or adhesive bonding.

Yet still another object of the present invention is to provide a nozzle flapper mechanism a nozzle flapper mechanism comprising: an electrostrictive device; a plate member coupled to said electrostrictive device; a nozzle having an orifice facing said electrostrictive device or said plate member; means for applying a voltage to said electrostrictive device to keep a nozzle back pressure constant or vary the nozzle back pressure; said electrostrictive device comprising a shim, a piezoelectric ceramics member disposed on said shim, and a thin-film electrode disposed on said piezoelectric ceramics member; and means for gripping said shim only.

A further object of the present invention is to provide a nozzle flapper mechanism wherein said shim is substantially T-shaped.

A still further object of the present invention is to provide a nozzle flapper mechanism wherein said shim includes a region free from said piezoelectric ceramics member and said electrode, said region having a plurality of holes spaced from each other, said shim being fixed in position by screws extending through said holes, respectively.

The above and other objects, features and advantages of the present invention will become more apparent from the following description when taken in conjunction with the accompanying drawings in which preferred embodiments of the present invention are shown by way of illustrative example. cl BRIEF DESCRIPTION OF THE DRAWINGS FIG. 1 is a vertical cross-sectional view of a nozzle flapper mechanism including a conventional bimorph electrostrictive device;

DETAILED DESCRIPTION OF THE PREFERRED EMBODIMENTS

The present invention is particularly applied to the configuration of an electrostrictive device.

Figure 1:
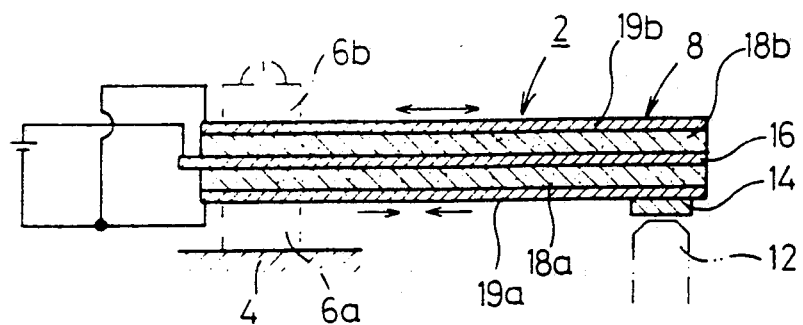
Figure 2:
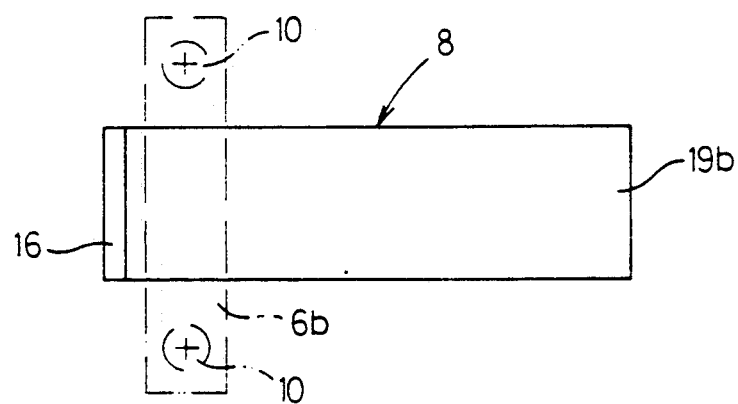
FIG. 2 is a plan view of the nozzle flapper mechanism shown in FIG. 1.
Figure 3:
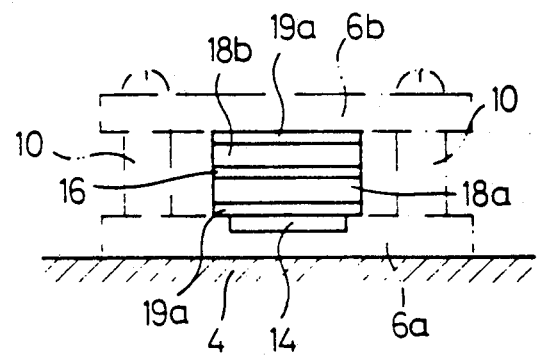
FIG. 3 is a front elevational view of the nozzle flapper mechanism of FIG. 1.
Figure 4:
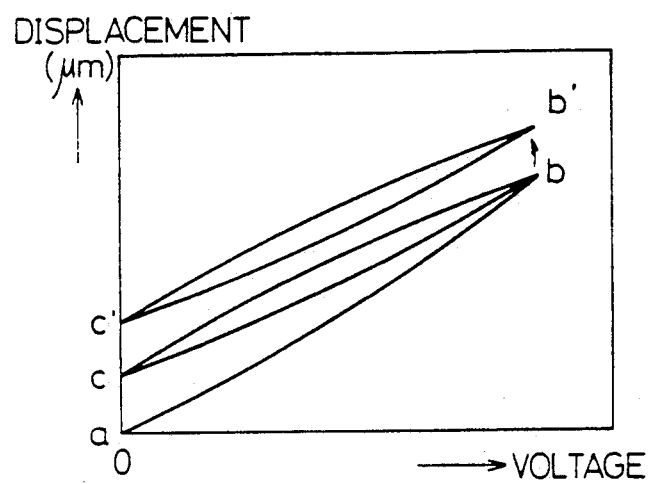
FIG. 4 is a graph showing the relationship between a voltage applied to the conventional bimorph electrostrictive device and an amount of displacement thereof.
Figure 5:
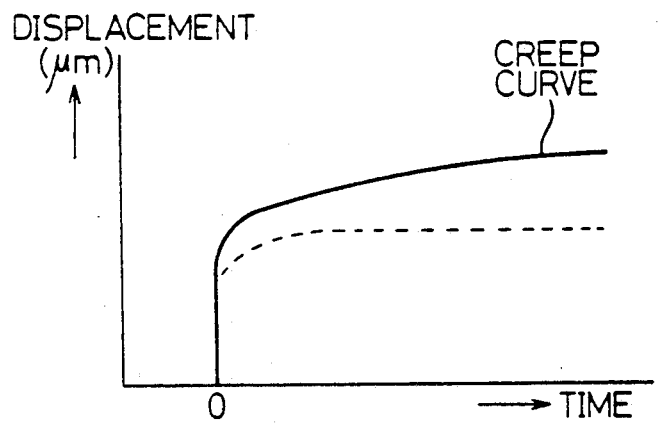
FIG. 5 is a graph showing creeping developed when a voltage remains applied to the conventional bimorph electrostrictive device for a long period of time.
Figure 6:
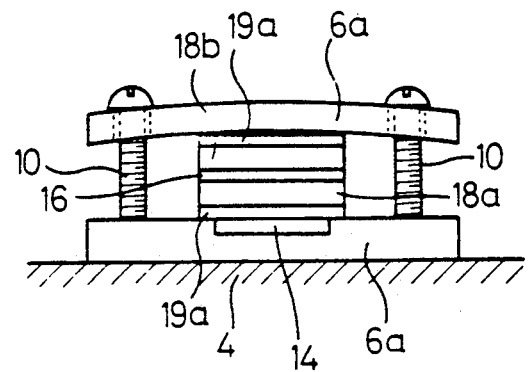
FIG. 6 is a front elevational view showing how the nozzle flapper mechanism of FIG. 1 is flexed.
Figure 7:
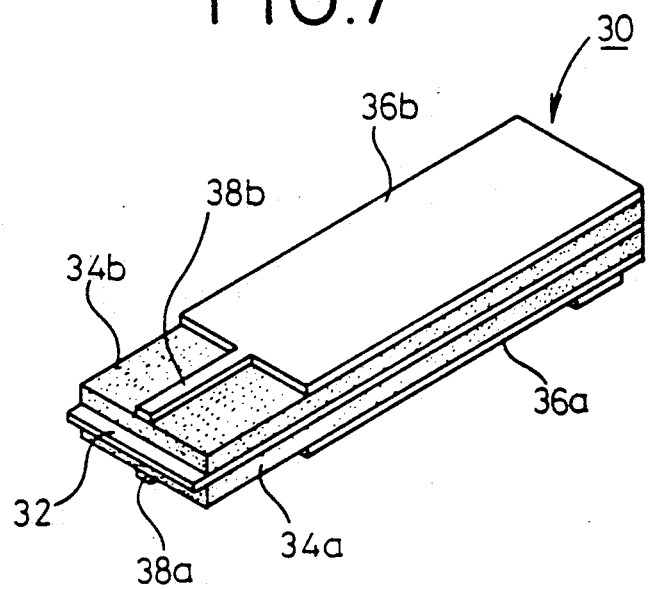
FIG. 7 is a perspective view of an electrostrictive device to be incorporated in a nozzle flapper mechanism according to the present invention.

According to a first embodiment shown in FIG. 7, an electrostrictive device 30 includes a shim 32 having a rectangular shape. The shim 32 is made generally of a metallic material such as phosphor bronze, stainless steel, or the like. Two piezoelectric ceramics members 34a, 34b are bonded to the opposite surfaces, respectively, of the shim 32 with an adhesive therebetween. The shim 32 has one end slightly projecting outwardly from the corresponding ends of the piezoelectric ceramics members 34a, 34b.

Figure 8:
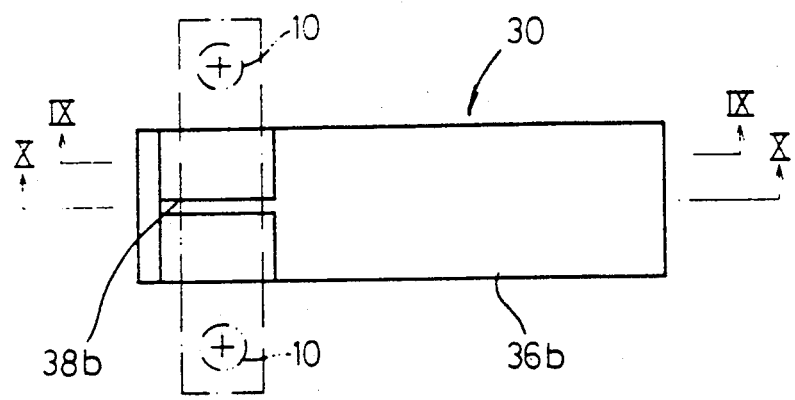
FIG. 8 is a plan view of the electrostrictive device shown in FIG. 7.
Figure 9:
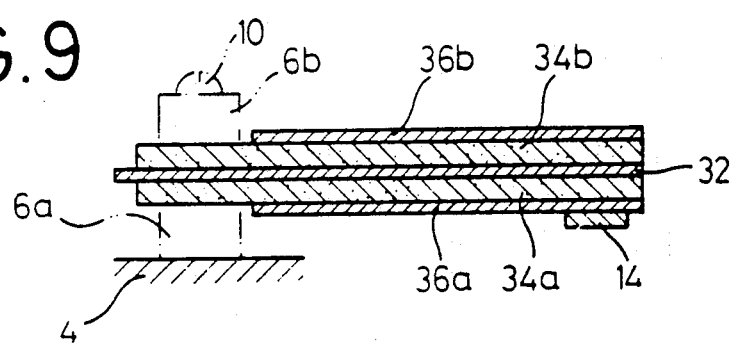
FIG. 9 is a cross-sectional view taken along line IX—IX of FIG. 8.
Figure 10:
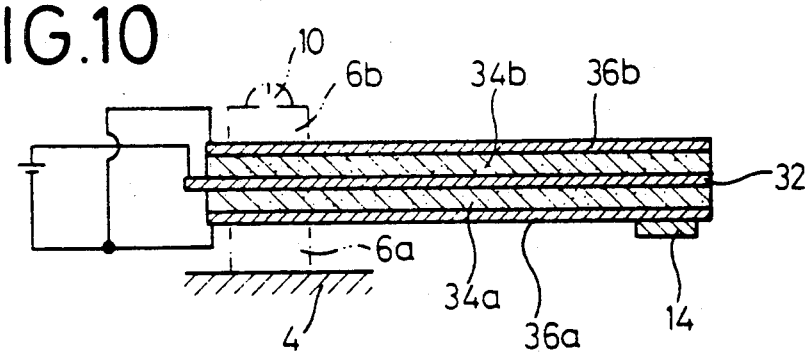
FIG. 10 is a cross-sectional view taken along line X—X of FIG. 8.
Figure 11:
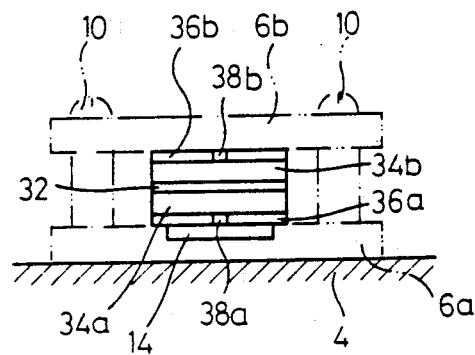
FIG. 11 is a front elevational view of the electrostrictive device shown in FIG. 7.

Two thin-film electrodes 36a, 36b are attached to the outer exposed surfaces, respectively, of the piezoelectric ceramics members 34a, 34b. As illustrated in FIG. 7, the electrodes 36a, 36b are substantially rectangular in shape and have a width or transverse dimension which is substantially the same as the width of the piezoelectric ceramics members 34a, 34b. Very narrow leads 38a, 38b extend respectively from the transverse centers of the electrodes 34a, 34b and terminate at the ends of the piezoelectric ceramics members 34a, 34b (see FIGS. 7, 8, and 10). An auxiliary plate 14 is attached to the lower surface of the free end of the electrostrictive device 30.

As shown in FIGS. 7 through 10, the electrostrictive device 30 is incorporated in a nozzle flapper mechanism in which the leads 38a, 38b of the electrodes 36a, 36b are placed over a first fixing plate 6a, and a second fixing plate 6b is positioned on the electrostrictive device 30. The electrostrictive device 30 is then firmly gripped between the first and second fixing devices 6a, 6b by means of fastening screws 10 extending through holes defined in the first and second fixing plates 10 and threaded into a base 4. The region of the electrostrictive device 30 which is clamped by the fastening screws 10 is free of the electrodes 36a, 36b, but only includes the leads 38a, 38b which are about 1 mm wide and a few μm thick. Therefore, only the shim 32, the piezoelectric ceramics members 34a, 34b, and the leads 38a, 38b are subjected to tightening forces with which the electrostrictive device 30 is fastened by the fastening screws 10. It is therefore not necessary to adjust such tightening forces with great care when fixing the electrostrictive device 30 to the fixing plates 6a, 6b.

When a voltage is applied to the electrostrictive device 30 that is combined with an electropneumatic transducer to convert an electric signal to a pneumatic pressure signal, any creeping of the electrostrictive device 30 is greatly reduced and hence the electrostrictive device 30 operates accurately and stably. It is possible to effect precise control especially when the electrostrictive device 30 is driven by a low voltage.

The electropneumatic transducer in which the electrostrictive device 30 of the invention is incorporated will be described below.

Figure 12:
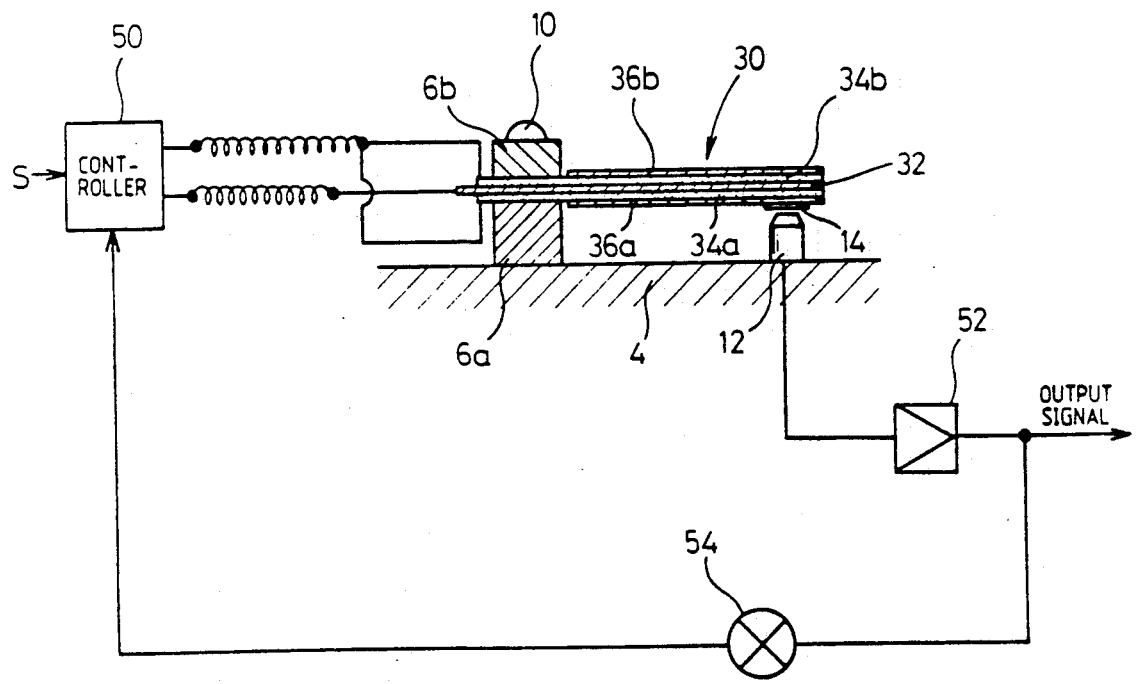
FIG. 12 is a schematic view showing an electropneumatic transducer in which the electrostrictive device of the invention is incorporated.

As illustrated in FIG. 12, the electrodes 36a, 36b attached to the piezoelectric ceramics members 34a, 34b are electrically connected to each other and also to one terminal of a controller 50. The other terminal of the controller 50 is electrically coupled to the shim 32. A nozzle 12 placed on the base 4 is pneumatically connected to a pilot valve 52 which has an output port branched and connected to a pneumatic-to-electric signal transducer 54, the output terminal of which is connected to the controller 50. The controller 50 is supplied with a control signal S.

When the control signal S is applied to the controller 50, the controller 50 applies a predetermined voltage between the electrodes 36a, 36b on the piezoelectric ceramics members 34a, 34b and the shim 32 to cause the free end of the electrostrictive device 30 to be flexed in proportion to the voltage. As a result, the nozzle back pressure of air ejected from the nozzle 12 is varied, and such a pressure variation is introduced into the pilot valve 52. An output signal from the pilot valve 52 is applied to a certain device to control the device.

The output signal from the pilot valve 52 is also applied to the pneumatic-to-electric signal transducer 54 which applies it as a feedback signal to the controller 50.

Figure 13:
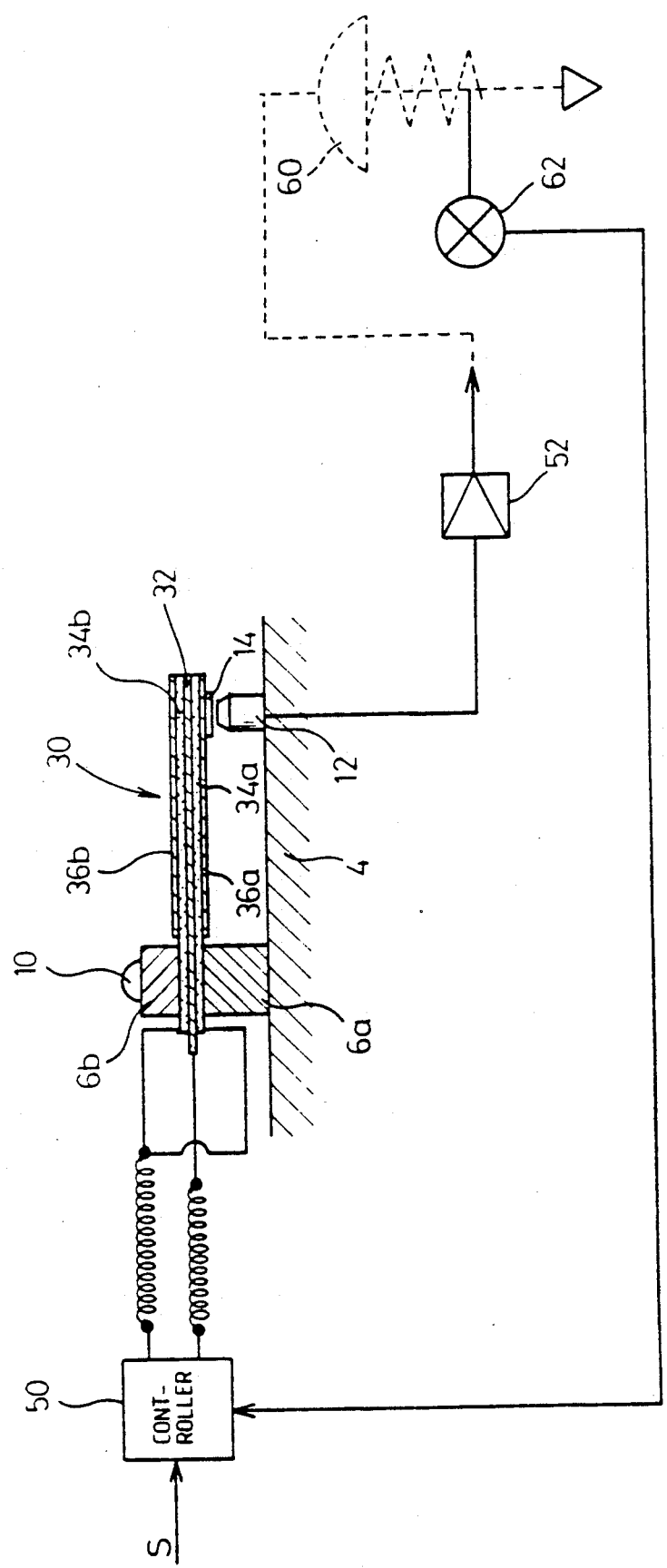
FIG. 13 is a schematic view of a positioner incorporating the electropneumatic transducer shown in FIG. 12.

FIG. 13 shows a positioner incorporating the electropneumatic transducer described above.

Those parts in FIG. 13 which are identical to those of the electropneumatic transducer are denoted by identical reference numerals, and will not be described in detail.

In FIG. 13, the output signal from the pilot valve 52 is applied to a control valve 60 to control the control valve 60, and an output signal from the control valve 60 is branched and applied to a sensor 62 for converting a displacement of the control valve 60 to a corresponding electric signal. The sensor may preferably be a potentiometer. An output signal from the potentiometer 62 is applied as a feedback signal to the controller 50. Therefore, the output signal applied to the pilot valve 52 displaces the control valve 60, and the output signal from the sensor 62 which is proportional to the displacement of the control valve 60 is applied to the controller 50 for feedback control.

Figure 14:
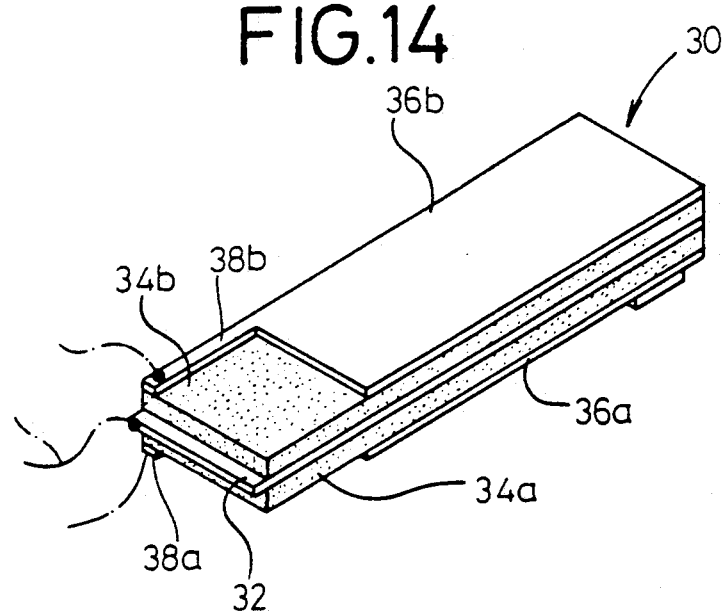
FIG. 14 is a perspective view of an electrostrictive device according to another embodiment of the present invention.

FIG. 14 shows an electrostrictive device 30 according to another embodiment of the present invention. The electrostrictive device 30 of FIG. 14 includes electrodes 36a, 36b having respective leads 38a, 38b which are positionally displaced to one side of piezoelectric ceramics members 34a, 34b with respect to longitudinal central lines thereof. Therefore, lead wires connected to a shim 32 and the electrodes 36a, 36b may be gathered and connected to one end corner thereof so that these lead wires will not physically interfere with other accessories and devices disposed near the electrostrictive device 30.

Figure 15:
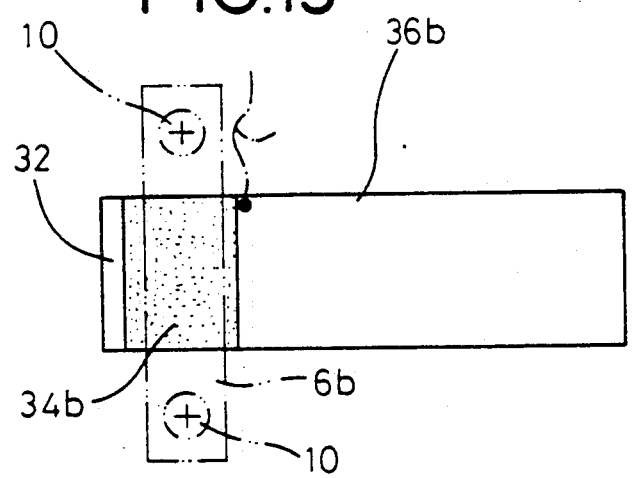
FIG. 15 is a plan view of an electrostrictive device according to still another embodiment of the present invention.
Figure 16:
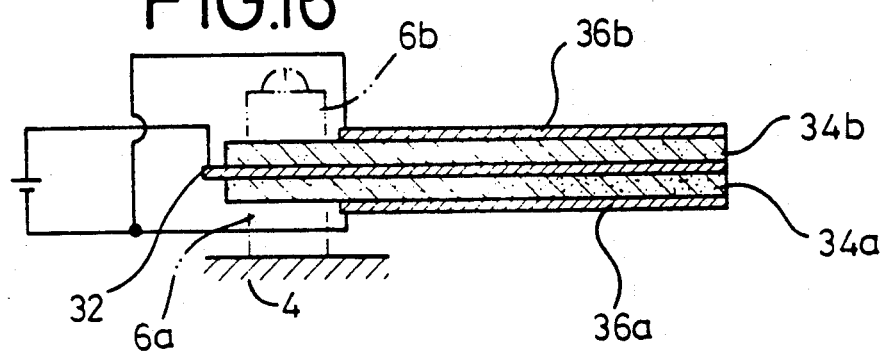
FIG. 16 is a vertical cross-sectional view, partly cut omitted from illustration, of the electrostrictive device illustrated in FIG. 15.

FIGS. 15 and 16 illustrate an electrostrictive device according to still another embodiment of the present invention. According to this embodiment, no leads 38a, 38b are employed, but only piezoelectric ceramics members 34a, 34b and a shim 32 are gripped between first and second fixing plates 6a, 6b. More specifically, electrodes 36a, 36b are shorter than the piezoelectric ceramics members 34a, 34b on the shim 32, and lead wires for applying a voltage to the electrostrictive device are connected to one corner of the electrodes 36a, 36b near the fixing plates 6a, 6b which grip the piezoelectric ceramics members 34a, 34b.

Since the electrodes 36a, 36b are not gripped by the fixing plates 6a, 6b and the piezoelectric ceramics members 34a, 34b are gripped by the fixing plates 6a, 6b, the electrostrictive device retains its own required rigidity while reducing creeping.

Even if there were leads 38a, 38b, any problem resulting from creeping could be avoided by not gripping such leads 38a, 38b with the fixing plates 6a, 6b. Other embodiments from such a standpoint will be described with reference to FIGS. 17 through 19.

Figure 17:
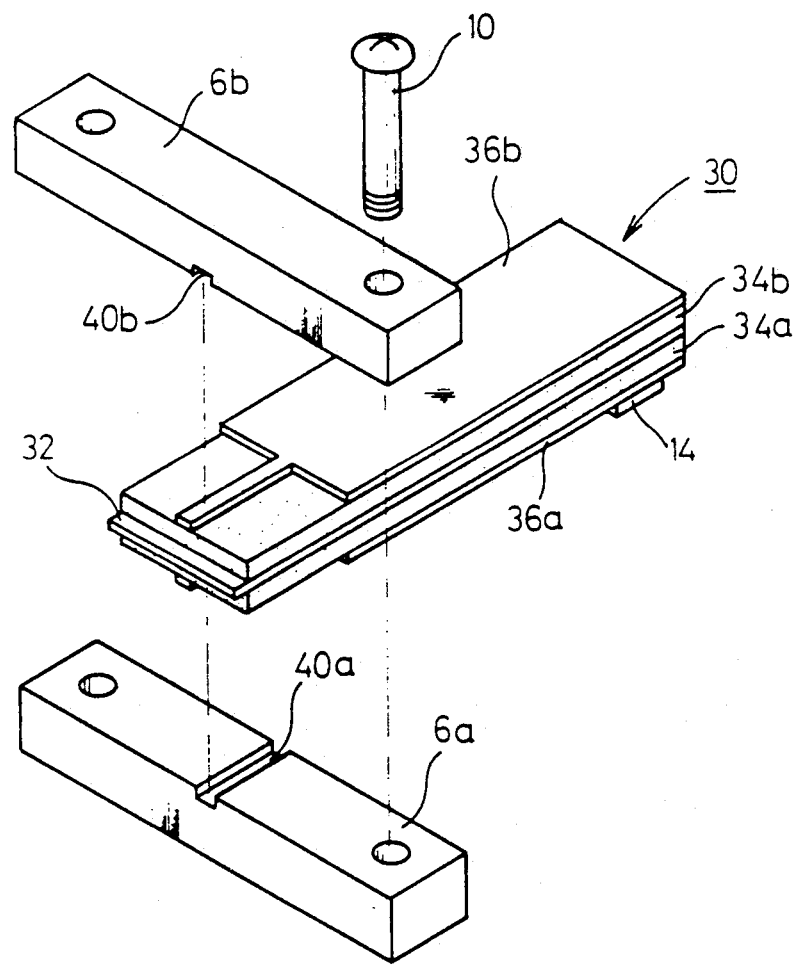
FIG. 17 is an exploded perspective view of the electrostrictive device of the invention and fixing plates for fixing the electrostrictive device.

According to an embodiment shown in FIG. 17, first fixing plates 6a, 6b have slots 40a, 40b defined and second fixing plates 6a, 6b have slots 40a, 40b defined respectively in their confronting surfaces. The slots 40a, 40b have a depth and length which are the same as the thickness and length of the leads 38a, 38b extending on the piezoelectric ceramics members 34a, 34b. Even when the end of the electrostrictive device 30 is gripped by the fixing plates 6a, 6b, the leads 38a, 38b are not gripped by the fixing plates 6a, 6b but are snugly received in the slots 40a, 40b, respectively, so that the electrostrictive device 30 is free of creeping.

Figure 18:
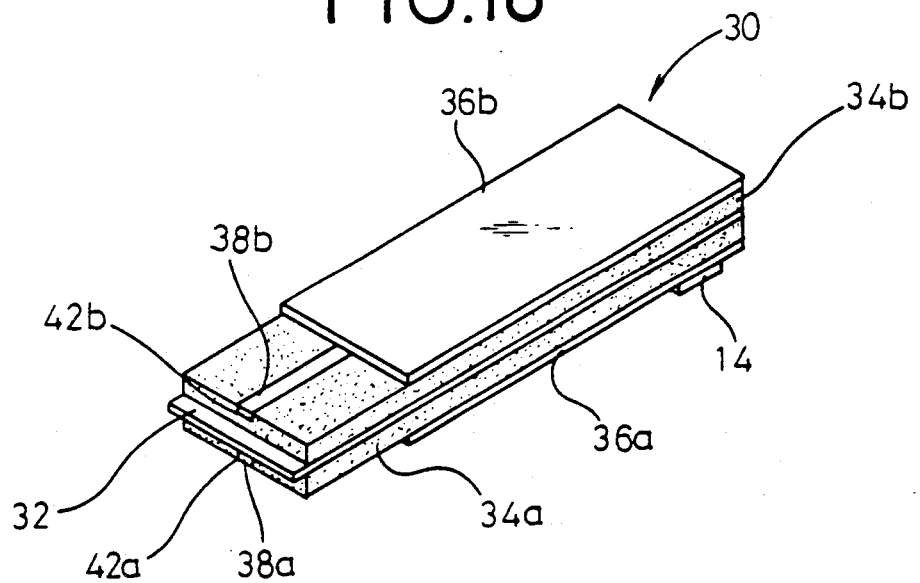
FIG. 18 is a perspective view of an electrostrictive device according to yet another embodiment of the present invention.
Figure 19:
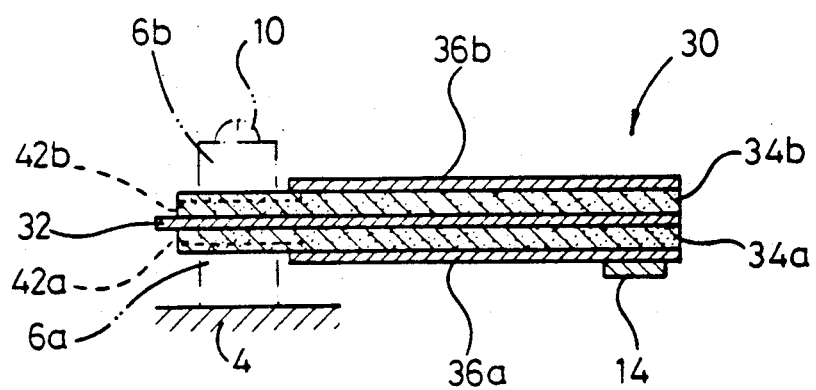
FIG. 19 is a vertical cross-sectional view of the electrostrictive device of FIG. 18.

In an embodiment illustrated in FIGS. 18 and 19, leads 38a, 38b are disposed respectively in slots 42a, 42b defined respectively in piezoelectric ceramics members 34a, 34b so that the leads 38a, 38b do not project from the surfaces of the piezoelectric ceramics members 34a, 34b. Therefore, even if the electrostrictive device is gripped by fixing plates 6a, 6b, the leads 38a, 38b are not gripped by the fixing plates 6a, 6b, thereby making the electrostrictive device free of creeping.

Figure 20:
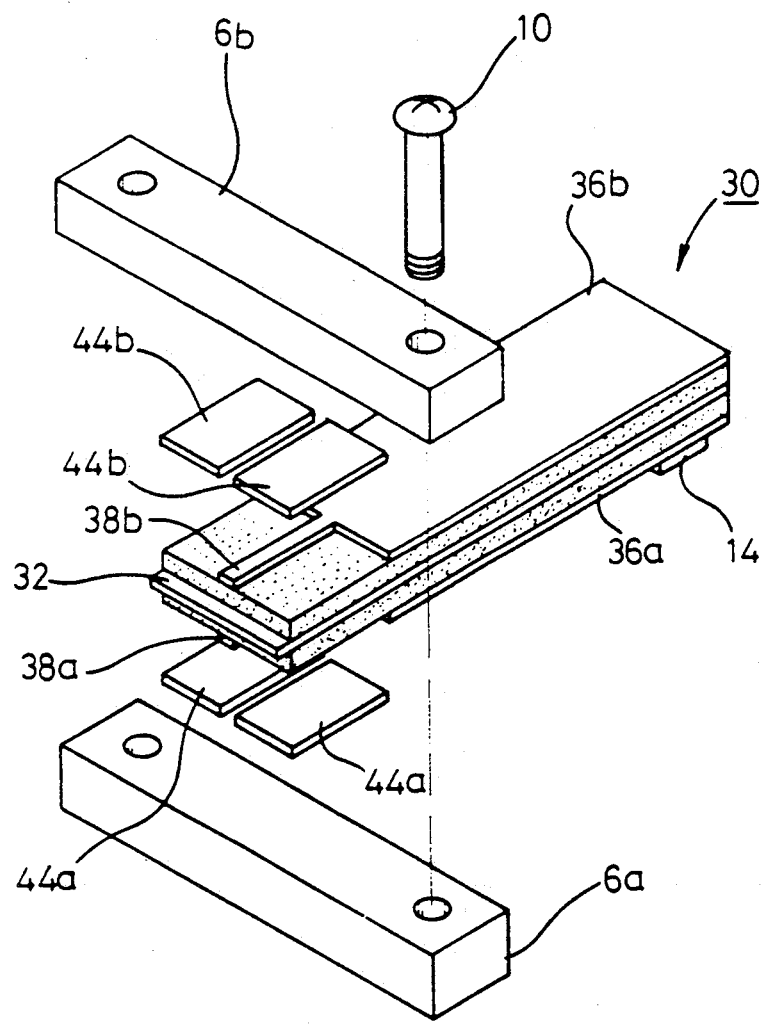
FIG. 20 is an exploded perspective view of the electrostrictive device of the invention and fixing plates of another embodiment for fixing the electrostrictive device.

FIG. 20 shows a further embodiment in which two pairs of spacers 44a, 44b are attached to the outer exposed surfaces, respectively, of the piezoelectric ceramics members 34a, 34b in complementary relation to the thickness and length of the leads 38a, 38b. The spacers 44a, 44b may alternatively be fixed to the fixing plates 6a, 6b, respectively. The electrostrictive device of this embodiment can avoid creeping as the fixing plates 6a, 6b are not directly pressed against the leads 38a, 38b.

In each of the above embodiments, the piezoelectric ceramics members 34a, 34b of the electrostrictive device 30 are gripped by the fixing plates 6a, 6b to give a desired degree of rigidity to the electrostrictive device 30.

Figure 21:
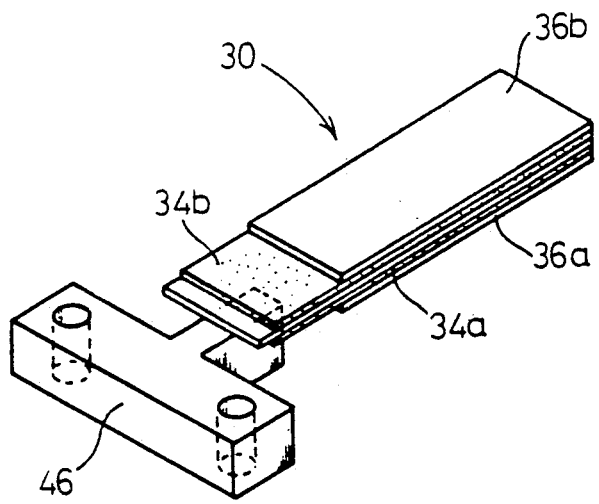
FIG. 21 is a perspective view of an electrostrictive device in accordance with a further embodiment of the present invention.

However, the piezoelectric ceramics members 34a, 34b may not be gripped if the desired rigidity can be kept by another means. FIG. 21 shows an embodiment based on such a concept.

In the embodiment of FIG. 21, a T-shaped holder 46 of a relatively large thickness is provided which is to be fixed to a base by screws (not shown), and a piezoelectric ceramics member 34a is fixed to the holder 46 by soldering or adhesive bonding. As illustrated, electrodes 36a, 36b terminate short of the soldered or bonded region on the holder 46. With the piezoelectric ceramics members 34a, 34b attached to the holder 46, the electrostrictive device can easily be installed in position, and can also easily be adjusted in position.

Figure 22:
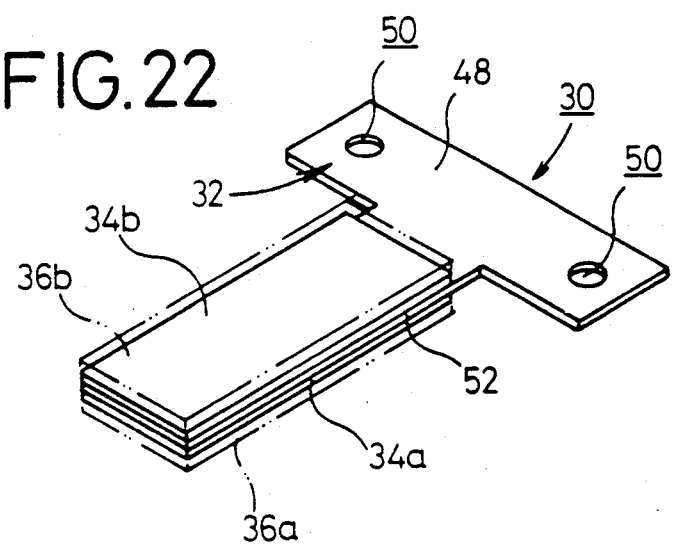
FIG. 22 is a perspective view of an electrostrictive device in accordance with a still further embodiment of the present invention.
Figure 23:
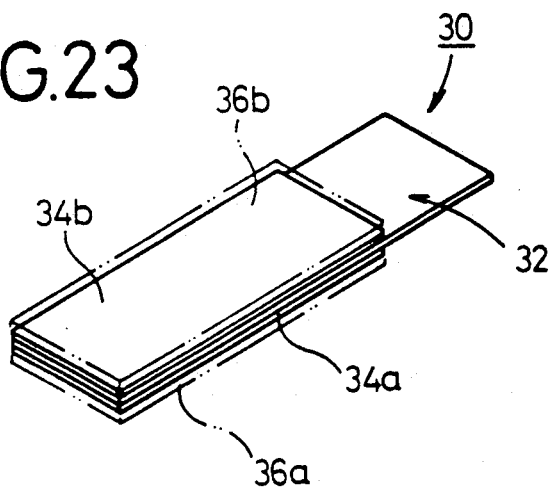
FIG. 23 is a perspective view of an electrostrictive device in accordance with a yet further embodiment of the present invention.

Further embodiments of the present invention are shown in FIGS. 22 and 23. In the embodiment of FIG. 22, an electrostrictive device 30 includes a T-shaped shim 32 having a region 48 with spaced holes 50 defined therein for the passage of fastening screws. The shim 32 has another region 52 which is sandwiched between piezoelectric ceramics members 34a, 34b applied respectively to lower and upper surfaces thereof with insulating members therebetween. Electrodes 36a, 36b are applied respectively to the piezoelectric ceramics members 34a, 34b. The piezoelectric ceramics members 34a, 34b and the electrodes 36a, 36b do not cover the region 48 where the holes 50 are defined.

A nozzle flapper mechanism incorporating the electrostrictive device 30 shown in FIG. 22 is constructed as follows:

The shim 32 is placed on the first fixing plate 6a, and the second fixing plate 6b is placed on the shim 32 over the holes 50. The fastening screws 10 are threaded through the holes defined in the second fixing plate 6b and the holes 50 to secure the electrostrictive device 30. Since the electrodes 36a, 36b and the piezoelectric ceramics members 34a, 34b do not extend into the region 48 which is tightened by the fastening screws 10, only the shim 32 is subjected to tightening forces by the fastening screws 10. Accordingly, no adjustments are required with respect to such tightening forces when fixing the electrostrictive device 30 between the first and second fixing plates 6a, 6b. The piezoelectric ceramics members 34a, 34b are fixed to the shim 32 through the intermediary of the insulating layers without any adhesive. Therefore, any voltage applied to the electrostrictive device is not adversely affected by an adhesive.

When a voltage is applied to the electrostrictive device 30 to convert an electric signal to a pneumatic pressure signal, the electrostrictive device 30 can operate stably without any concern over tightening forces applied thereto. The electrostrictive device 30 can effect accurate control especially when it is to be driven by a low voltage.

FIG. 23 shows an embodiment in which a shim 32 has a simpler rectangular shape. The shim 32 has a region where electrodes 36a, 36b and piezoelectric ceramics members 34a, 34b are not applied. Such a region is gripped by the first and second fixing plates 6a, 6b to make the electrostrictive device free of creeping.

Figure 24:
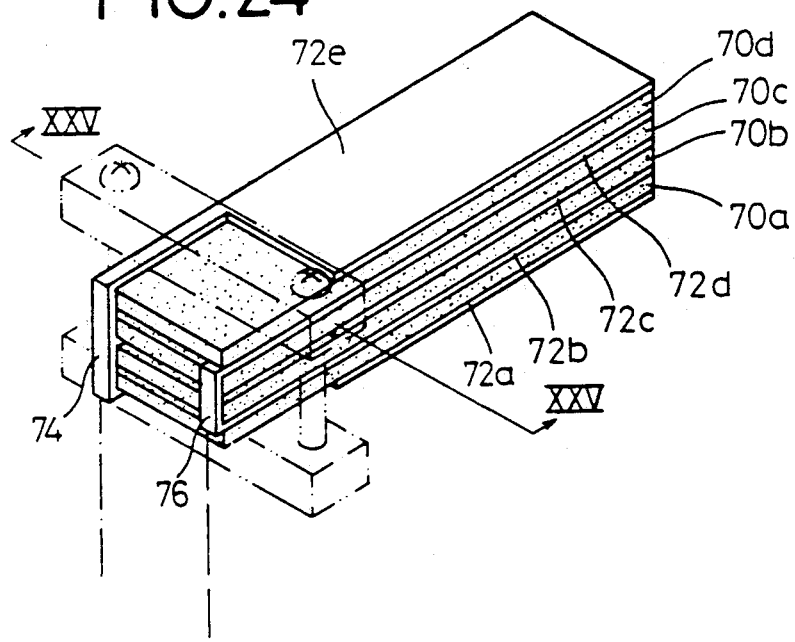
FIG. 24 is a perspective view of a nozzle flapper mechanism according to another embodiment of the present invention, showing a laminated structure of piezoelectric ceramics members and electrodes.
Figure 25:
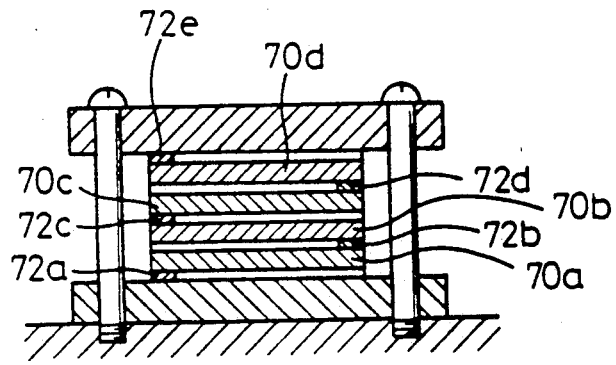
FIG. 25 is a cross-sectional view taken along line XXV—XXV of FIG. 24.

While a nozzle flapper mechanism is composed of a single bimorph electrostrictive device in each of the previous embodiments, the present invention is also applicable to a laminated electrostrictive device assembly comprising a plurality of electrostrictive devices as shown in FIGS. 24 and 25.

In the embodiment of FIGS. 24 and 25, the laminated electrostrictive device assembly includes a plurality of piezoelectric ceramics members 70a through 70d, and electrodes 72a through 72e attached to faces and backs of the piezoelectric ceramics members 70a through 70d. The laminated electrostrictive device assembly includes no shim, but has the same electrode structure as that of the electrodes 36a, 36b as shown in FIG. 14. The electrodes 72a, 72c, 72e have leads which are disposed in one localized position, and the electrodes 72b, 72d have leads which are located in another localized position which is on an opposite side to said one localized position. The leads are positioned in this manner in order to prevent themselves from being localized in one position in the stacked construction of the piezoelectric ceramics members.

The electrodes 72a, 72c, 72e are electrically connected to each other by a single electric conductor 74, whereas the electrodes 72b, 72d are electrically connected to each other by a single electric conductor 76.

Figure 26:
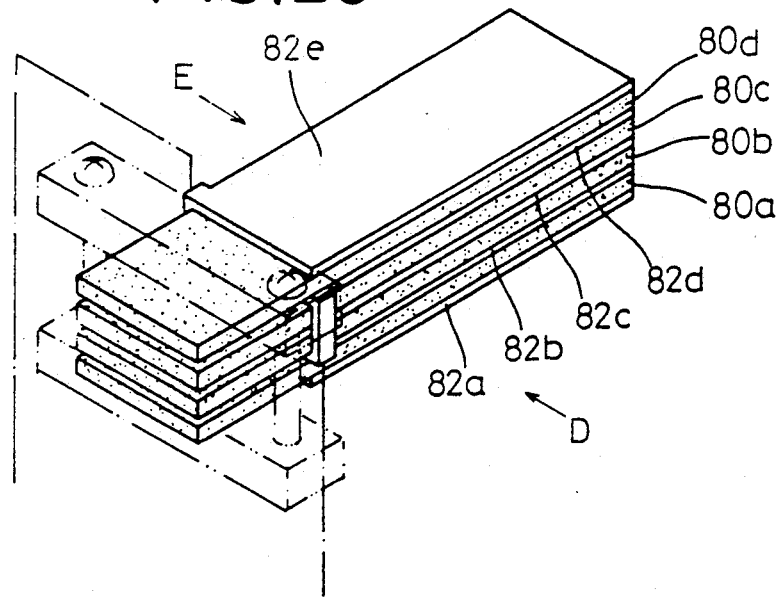
FIG. 26 is a perspective view of a nozzle flapper mechanism according to still another embodiment of the present invention, showing a laminated structure of piezoelectric ceramics members and electrodes.
Figure 27:
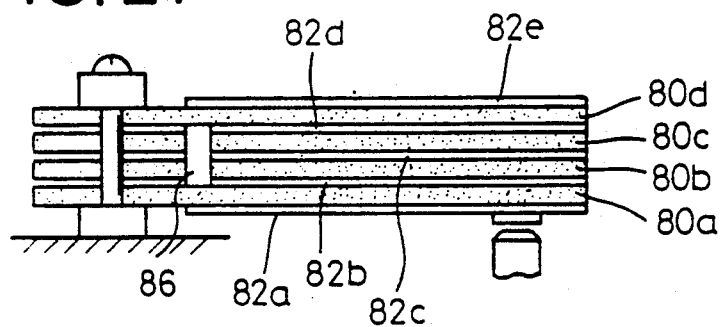
FIG. 27 is a view as viewed in the direction of the arrow D in FIG. 26.
Figure 28:
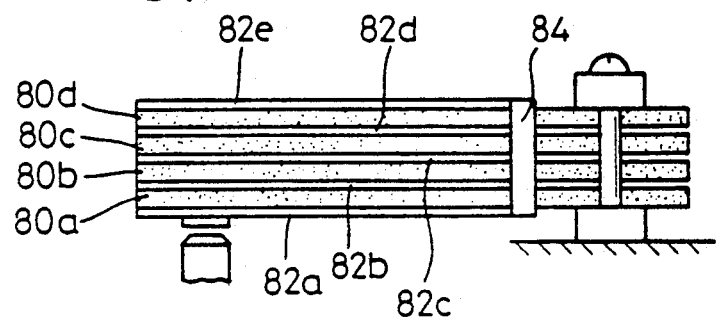
FIG. 28 is a view as viewed in the direction of the arrow E in FIG. 26.

FIGS. 26 through 28 shows still another embodiment which is substantially similar to the embodiment of FIGS. 24 and 25, except for the shape of electrodes applied to piezoelectric ceramics members 80a through 80d. The electrodes shown in FIGS. 26 through 28 are rather of a structure which is substantially the same as the electrode structure shown in FIG. 15. However, in this embodiment, the electrodes 82a, 82c, 82e are electrically connected to each other by an electric conductor 84, whereas the electrodes 82b, 82d are electrically connected to each other by an electric conductor 86.

With the illustrated laminated structure, the electrostrictive device assembly can be flexed to a larger extent, and the piezoelectric ceramics members can retain a desired degree of rigidity without the need for a shim.

It is possible to employ twenty through forty electrostrictive devices in the laminated assembly shown in FIGS. 24 through 28.

With the present invention, as described above, the electrodes of the electrostrictive device are not gripped by the fixing plates, and the region in which the piezoelectric ceramics members are subjected to expansion and contraction upon application of a voltage to the electrodes is free from tightening forces produced by the fixing plates. Therefore, the electrostrictive device and hence the nozzle flapper mechanism incorporating the same are not adversely affected by such tightening forces, and hence undergo as small creeping as possible. The nozzle flapper mechanism is thus capable of accurately controlling its nozzle back pressure.

Although certain preferred embodiments have been shown and described, it should be understood that many changes and modifications may be made therein without departing from the scope of the appended claims.

What is claimed:

1. A nozzle flapper mechanism comprising:
   an electrostrictive device;
   a plate member coupled to said electrostrictive device;
   a nozzle having an orifice facing the plate member on said electrostrictive device; and
   means for applying a voltage to said electrostrictive device to keep a nozzle back pressure constant or vary the nozzle back pressure;
   said electrostrictive device comprising a plurality of piezoelectric ceramics members, and a plurality of thin-film electrodes disposed on faces and backs of said piezoelectric ceramics members;
   wherein said electrodes have leads extending respectively therefrom, said leads also being disposed on the faces and backs of said piezoelectric ceramics members positioned to one side thereof, the lead from each of said electrodes being positioned on an opposite side of the electrostrictive device with respect to the lead from an adjacent one of said electrodes.

2. A nozzle flapper mechanism according to claim 1, further including an electric conductor connected to alternating ones of said electrodes on said piezoelectric ceramics members and connecting said alternating ones of the electrodes to a power supply.

3. A nozzle flapper mechanism according to claim 1, wherein the leads from said electrodes are positioned alternately on opposite sides.

* * * * *